April 19, 1966 W. B. MORRISON 3,247,464

AUDIO AMPLIFIER INCLUDING VOLUME COMPRESSION MEANS

Filed Sept. 8, 1961 2 Sheets-Sheet 1

INVENTOR.
WILLIAM B. MORRISON

BY Eugene M. Whitaker

Attorney

AUDIO AMPLIFIER INCLUDING VOLUME COMPRESSION MEANS

Filed Sept. 8, 1961 2 Sheets-Sheet 2

INVENTOR.
WILLIAM B. MORRISON
BY Eugene M. Whitacre
Attorney 3,247,464

AUDIO AMPLIFIER INCLUDING VOLUME COMPRESSION MEANS

William B. Morrison, Beaconsfield, Quebec, Canada, assignor to Radio Corporation of America, a corporation of Delaware Filed Sept. 8, 1961, Ser. No. 136,815
11 Claims. (Cl. 330—89)

Figure 1:
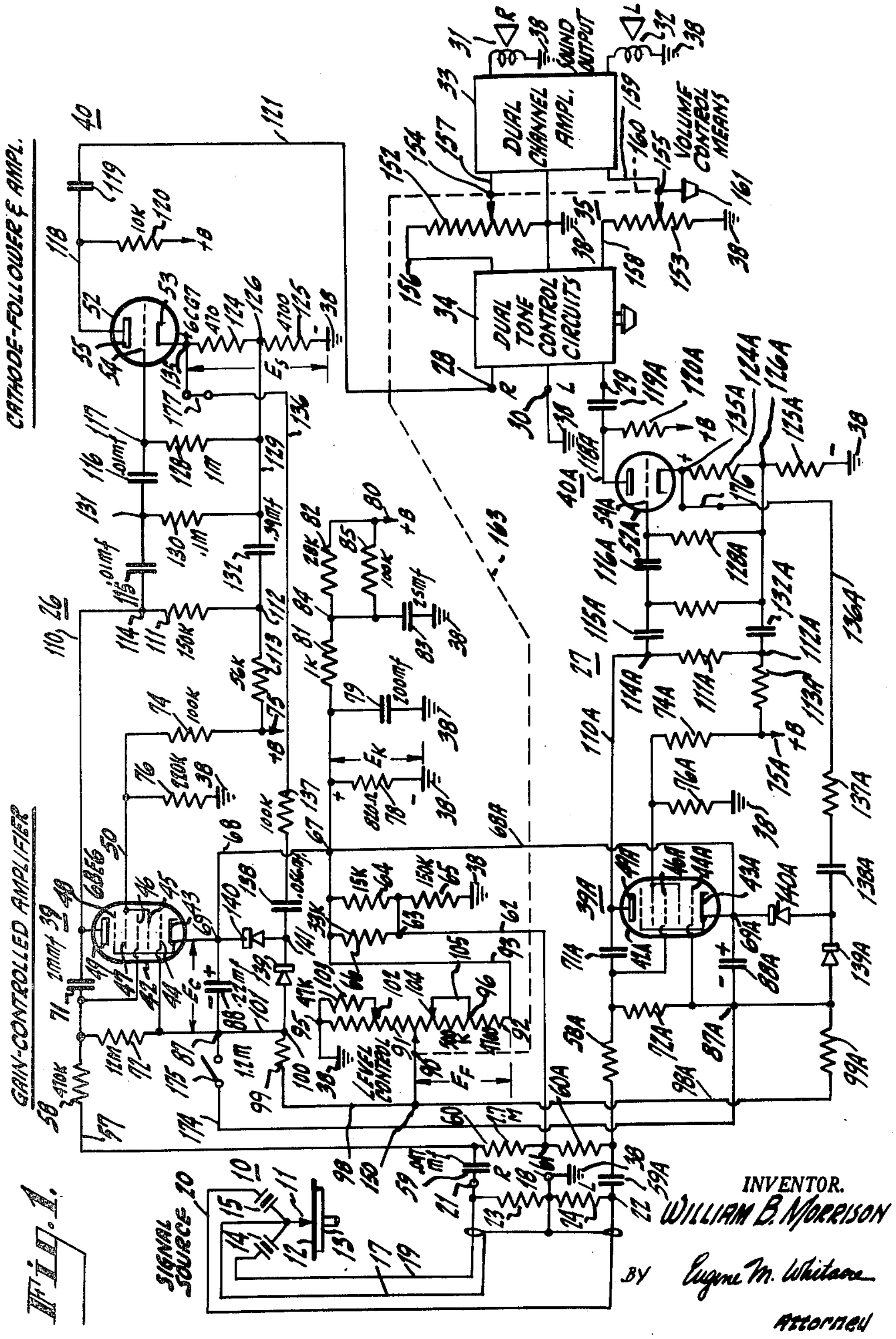

The present invention relates to audio-frequency signal amplifiers, and more particularly to amplifier systems of this type which provide automatic volume or amplitude-compression in the signal translation therethrough. Such systems generally provide changes in the transconductance of one or more electronic-tube signal amplifier stages as a function of a signal-variable control voltage to reduce the normal dynamic or amplitude variation range of the translated and reproduced sound signals.

Volume compression (or expansion) through variation of transconductance involves dynamic changes in plate or operating current in the gain-controlled amplifier stage or stages which may produce low-frequency sound components or "thumps" in the signal reproduction. The time constants of the compression (or expansion) action should be made relatively long to place such sound components in a subaudible frequency range. However, with modern high-fidelity amplifier systems for sound reproduction, having a relatively-wide frequency response range, this is difficult to provide without compromising the attack time which should be made as short as possible.

Other volume compression (or expansion) systems have used push-pull transformer or dummy loading circuits for balancing the effects of changes in plate or operating currents. Such systems represent a departure, in any case, from the more desirable single-ended form of a signal amplifying or translating channel, as normally provided without compression or expansion gain-control circuitry.

In providing audio-frequency signal amplitude compression for commercial equipment, such as home radio and television receivers, phonographs, radio-phonograph combinations, and like sound reproducing systems, simplicity of construction and low cost are important considerations, thus pointing to the desirability of single-ended amplifier circuits for this use, as compared with the more complicated push-pull or balanced circuits heretofore used.

Accordingly, it is an object of this invention to provide an improved audio-frequency signal amplifying system which provides effective volume or signal amplitude-compression while maintaining a single-ended circuit structure and thereby eliminating push-pull transformer and dummy loading circuits heretofore required for balancing out the effects of dynamic changes in plate or like operating current.

An amplifier or signal translating system embodying the invention is particularly useful in connection with phonograph record-reproducing systems and operates effectively to reduce the dynamic range of the information on a record without the loss of significant portions of this range below the level or threshold desired by the listener. When a record is played at a natural volume or sound level, substantially no amplitude compression is required, but as this level is lowered, the lower level passages in the recorded sounds may reach levels which are no longer perceptible to a listener. By the incorporation of amplitude compression in accordance with the invention, the lower level passages below a set or established threshold or level effectively are not attenuated and hence are reproduced in original amplitude relation. Since the amount of compression desired depends upon the sound level, it is desirable to have the degree of compression vary with the main volume or sound level setting of the amplifier or signal translating system.

It is therefore a further object of this invention to provide an audio-frequency signal amplitude-compression system for low-level sound reproduction with reduced but effective dynamic range, which is "thump-free" in operation while being single-ended in form.

It is still a further object of this invention to provide an improved single-ended, audio-frequency signal amplitude-compression system which is quiet in its operational control functions and yet is adapted for the reproduction of wide dynamic range audio-frequency signals from sound recordings on records and tapes, from received radio programs and the like, at low background music or sound levels, effectively without the loss of significant portions of the original dynamic signal or sound range below the level or threshold desired by a listener.

Modern audio-frequency signal amplifiers for commercial equipment, such as phonograph record reproducing systems, may provide multiple-channel signal translation for two or more stereophonically-related signals originating from the same program or recording. Such systems provide a common control of the gain or volume level in the several signal translating channels. It is therefore a still further object of this invention to provide an improved multiple-channel amplitude-compression audio-frequency signal amplifier system, for wide-range stereophonic phonograph recordings and the like, in which the compression-controlled portions of the signal translating or amplifying channels thereof are single-ended in form and quiet in operation and the degree of compression is variable with the main volume or sound level setting of the system.

In multiple-channel amplifier systems, the operating level for compression is varied with the volume or gain-control setting as for single-channel amplifier systems, but the compression action is independent in each channel. However this action may be placed under control of one channel as may be desired. In any case, the amount of compression required depends upon the sound or output level desired from each signal translating channel. By the incorporation of this improved amplitude compression in the signal translating channels, the low-level passages in any case are not attenuated as much and effectively do not fall below the desired sound threshold or level. The level of the minimum or low-level sound reproduction at the lower end of the dynamic range is ordinarily not reduced so low that the reproduction is no longer perceptible or audible to any useful degree.

In accordance with the invention, each amplifier or signal translating channel of the signal translating system includes a single-ended volume or amplitude-compression system embodying a minimum number of amplifier and control elements with at least two cascaded amplifier stages providing relatively high control-signal gain and a feedback gain-control loop providing a relatively wide range of control, and being responsive to relatively high signal amplitudes without distortion in the signal output therefrom.

Among other things, the first stage of the amplifier system is gain-controlled jointly in response to an adjusted level-control and delay bias voltage from a fixed source and a signal-variable bias voltage effective above the delay bias setting for amplitude or volume compression in response to applied signals. The signal bias is developed by a high-efficiency diode rectifier circuit connected with a low-impedance signal source comprising an unbypassed cathode resistor element in the second stage. The plate or output circuit of the first amplifier stage is "bootstrapped" to this cathode resistance element for raising the load impedance and gain of the gain-controlled first stage.

The diode rectifier circuit which provides signal rectification, includes elements providing a time-delay or filter network, the constants of which determine the attack and recovery times of volume-compression action. The problem of "thump," generally caused by rapid plate or like operating current variation or D.C. shift in the controlled circuits, is minimized due to the degenerative action of resultant D.C. signal components in the diode rectifier circuit, and attenuation in the interstage coupling circuits.

The apparent loudness of amplified sound signals is determined by the average loudness which is generally 10–20 db below the instantaneous peaks. An amplifier in accordance with the invention provides compression in the upper 10–15 db of its input range, whereby these peaks can be kept to lower maximum instantaneous peaks without effecting the apparent loudness. By way of example, a compression of 6 db can thus achieve from a 2.5-watt amplifier, the appparent loudness conventionally requiring a 10-watt amplifier without compression, assuming that the peaks just reach distortion due to overload in each case. Amplifier size or wattage may thus be conserved for a given effective power output.

The invention will, however, be further understood from the following description of certain embodiments thereof, when considered in connection with the drawings, and its scope is pointed out in the appended claims.

Figure 2:
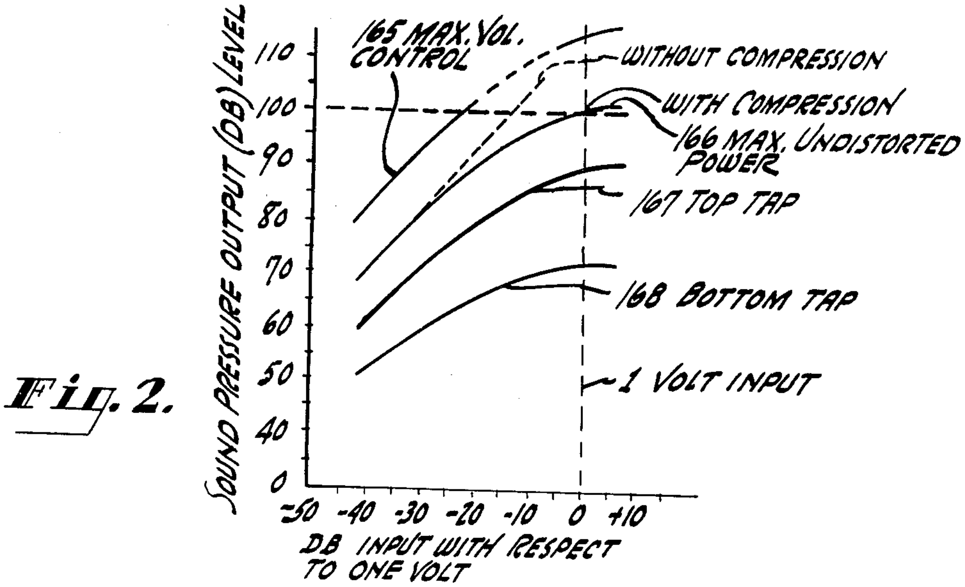
Figure 3:
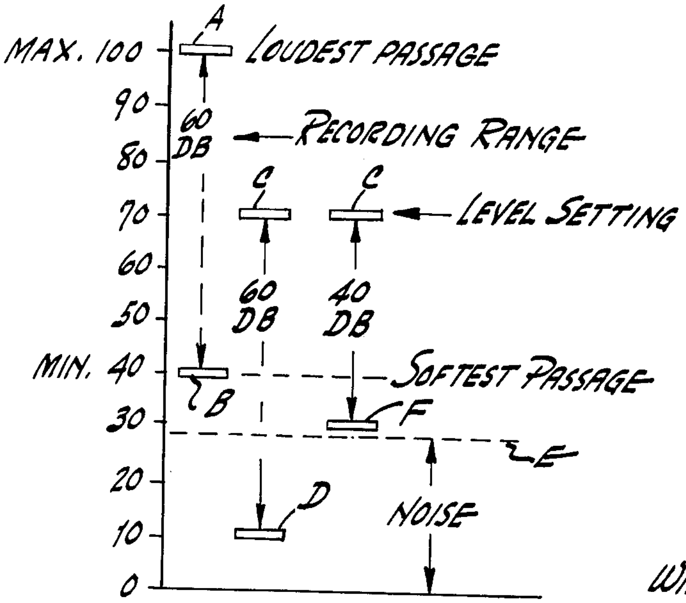

In the drawings, FIGURE 1 is a schematic circuit diagram of an audio-frequency signal translating system embodying the invention, and FIGURES 2 and 3 are graphs showing curves and indicia illustrating certain operating characteristics of the circuit of FIGURE 1 in accordance with the invention.

Referring to FIGURE 1, the system shown is a two-channel stereophonic signal-translating or amplyfying system for sound reproduction from any suitable signal source. In the present example the signal source is represented as a stereophonic phonograph pickup device 10 having a stylus element 11 for engaging the sound groove of a phonograph record 12 on a rotary turntable 13, and actuating electro-mechanical transducer elements 14 and 15 for translating the right and left-channel recordings, respectively, of the stereophonically-related signals in the sound groove. The transducer elements are connected to a common output lead 17 which is connected to a common input terminal 18 for the input circuits of the system. The individual signal output leads 19 and 20 from the transducers 14 and 15 are suitably shielded and connected respectively to right and left-channel input circuit terminals 21 and 22 for the stereophonic signal channels. Suitable load resistors 23 and 24 are provided for the transducer elements 14 and 15 respectively and are connected respectively between the common ground lead 17 and the signal output leads 21 and 22.

The channel input circuit terminals 21 and 22, and the common input circuit terminal 18, are connected with the respective right and left amplifier channels 26 and 27, each of which provides amplitude-compression control of the signal translation therethrough, in accordance with the invention, and are provided with channel output circuit terminals 28 and 29 respectively, and a common output circuit terminal 30.

The phonograph-record sound-reproducing system of the present example, is further provided with the usual channel sound reproducing output devices such as right and left channel loudspeakers 31 and 32. These are connected, as indicated, through dual-channel intermediate amplifier units or elements 33 and 34, and volume control means 35, of the overall system, for further controlling and translating the overall sound signal output from the system.

The phonograph record reproducing system shown is particularly adapted for the application of the signal amplitude-compression in accordance with the invention, since phonograph records provide a relatively-wide sound amplitude-variation range, and this is true of stereophonic as well as monophonic records. Therefore an audio-frequency signal amplitude-compression system may be provided in one signal translating channel, or as in the present example, in each of the signal translating channels, and both channels may be controlled from one or the other, as will hereinafter appear. Since both of the signal-translating channels 26 and 27 are alike in construction and operation and may be used singly in monophonic or single-channel systems, only one need be described in detail herein, and for this purpose the right channel 26 is chosen.

The input terminals for the right channel 26 are the terminals 21 and 18, the latter being connected to chassis or common ground 38 for the system, and the corresponding output terminals for the channel are the terminals 28 and 30, the latter also being connected to chassis or common ground 38, like the input terminal 18. Between the input and output terminals of the signal channel are connected signal-translating and amplitude-compression means comprising a first gain-controlled amplifier stage 39 and a second cathode-follower and amplifier stage 40, in cascade signal-translating relation. In this system, wide dynamic-range signals applied to the input terminals from the source are translated successivly through the two stages single-ended and delivered to the output terminals without distortion, in controlled and amplified form, for further translation through the remainder of the sound-reproducing system and reproduction at low background sound levels without loss of any significant portion of the dynamic range effectively below such levels.

The active amplifier element of the first or gain-controlled amplifier stage 39 is an electronic amplifier tube 42 of the pentagrid-type having a cathode 43, first, second, third, fourth and fifth grids 44, 45, 46, 47 and 48 respectively, and an anode or plate 49. The first and third grids 44 and 46, are signal or control grids, and the second and fourth grids 45 and 47 are connected together as a screen grid having a common input lead 50. The fifth grid 48 is a suppressor grid connected to the cathode 43 as shown. As indicated, the electronic amplifier tube 42 of the present example may be of a type known commercially as a 6BE6 tube.

The active amplifying element of the second stage 40 is a second electronic amplifier tube 52 having a cathode 53, a signal input or control grid 54 and an output anode or plate 55. As indicated, this triode amplifying element may be provided by a commercially available 6CG7 tube. Other suitable commercial types may be used however in lieu of those indicated, provided they are the proper operating characteristics.

The second control or signal input grid 46 of the first stage tube is connected with the channel input terminal 21 through a signal input circuit 57 which includes a series isolating resistor 58, a series input coupling capacitor 59 and a shunt grid circuit resistor 60. The last is connected to a common bias-voltage terminal 61 and a bias-voltage supply conductor 62 which may be connected to any suitable fixed source. In the present example a source of fixed biasing potential is provided at a tap connection 63 for the supply conductor 62 on a voltage-divider resistor network comprising two series voltage-divider resistors 64 and 65 connected effectively between the first-stage cathode 43 and system ground 38, and with a shunt voltage adjusting resistor element 66 connected in parallel with the divider resistor element 64. In the cathode connection referred to, the network resistors 64 and 66 are connected with a positive voltage supply terminal 67 which is connected directly through a lead 68 with a terminal 69 and the cathode 43, the terminal 69 being hereinafter referred to as the cathode terminal.

The signal input grid 46 is also coupled to the anode 49 through a feedback coupling capacitor 71 and is also D.-C. conductively connected with the first control grid 44 through a high-resistance path comprising a resistor 72 which, in the present example, may have a resistance of substantially 12 megohms. With regard to the other circuit elements, the series isolating resistor 58 may be considered to have a resistance of 470,000 ohms, the grid resistor 60 to have a resistance value of 2.7 megohms, and the capacitors 59 and 71 to have capacity values respectively, of .047 mf. and 2 mmf. The voltage-divider network may provide resistance values for the resistors 64, 65 and 66 respectively, of 15,000 ohms, 150,000 ohms, and 33,000 ohms in the present example. Throughout the circuit of FIGURE 1, electrical values of the above and others of the circuit elements are indicated, with resistance values given in ohms.

The screen grid 45–47 for the signal input grid 46 is connected through the input conductor 50 and a relatively high-resistance series screen resistor 74 to a positive source of operating voltage represented by the B+ supply lead 75, for which the zero voltage or negative terminal is system ground 38, as is understood. The screen supply circuit is provided with a relatively-light bleeder resistor 76 connected between the conductor 50, or the screen end of the series supply resistor 74, to system ground 38. The series supply resistor 74 may be considered to have a value of 100,000 ohm in the present example and the shunt bleeder resistor may be considered to have a value of 220,000 ohms. It will be noted that both resistors are unbypassed for low frequencies, however a small bypass capacitor may be necessary to insure stability against parasitics, and the operation of this supply circuit in the system will hereinafter be described.

The cathode terminal 69 and the positive supply terminal 67, being connected directly together, are maintained at the same fixed positive potential above system ground, whereby the cathode potential of the gain-controlled amplifier stage 39 does not vary to any appreciable degree during the operation of the system. To insure this potential stability for the cathode 43 and the compression control system generally, a heavily-loaded bleeder type supply network is provided in connection with the positive supply terminal 67 and with the positive operating voltage or current supply means for the amplifier system. This comprises a low-resistance cathode resistor 78 for the first stage connected between the supply terminal 67 and system ground 38 and provided with a relatively large shunt bypass or filter capacitor 79. The cathode resistor may be considered to have a resistance of 820 ohms in the present example and the capacitor may have a capacity of 200 mf.

In order to establish a desired bias supply voltage drop across the cathode resistor 78, bleeder current is supplied thereto from the positive operating-voltage supply circuit represented by the positive B+ supply lead 80. This bleeder current is supplied through a series R-C (resistance-capacitance) filter network comprising two series-connected resistors or resistor elements 81 and 82 between the lead 80 and the terminal 67, and a shunt filter capacitor 83 connected from the junction 84 of the resistor elements to system ground 38. The resistor elements 81 and 82 may be considered to have resistance values of 1000 ohms and 28,000 ohms respectively, and the filter capacitor 83 may have a capacitance value of 25 mf. in the present example. The resistor element 82 is provided with a shunt voltage-drop adjusting resistor element 85, for establishing the desired bias supply potential at the terminal 67 and on the cathode 43. In the present example this may have a value of 100,000 ohms.

It will be seen that with this supply circuit a relatively heavy bleeder current is applied to the heavily-bypassed and low-resistance cathode resistor 78, resulting in a substantially fixed cathode and bias supply potential between the positive terminal 67 and system ground as indicated at $E_K$. Since the signal grid 46 of the gain-controlled amplifier tube 42 is connected to the terminal 67 through the bias voltage-divider network 64–65–66, hereinbefore referred to, it receives a fixed biasing potential with respect to the cathode 43.

The first or gain-control grid 44 is provided with a variable control bias for establishing the operating level of the amplification or gain through the channel 26, and for setting the level at which the system may respond to variations in the amplitude of an applied signal through the channel. This control biasing voltage with respect to the cathode 43 is applied to the grid 44 at a voltage supply terminal 87. The voltage between this terminal and the cathode terminal 69 is stabilized by a capacitor 88 connected between these terminals as shown. Thus the bias voltage on the gain control grid 44 with respect to the cathode 43 is determined at any time by the fixed bias component across the capacitor 88 as set for level control. This capacitor is also part of the signal-responsive compression control circuitry, as described hereinafter, and stabilizes the signal-variable bias component of the control bias on the grid 44. The latter component will hereinafter be referred to as $E_C$, as indicated in the drawing.

The bias voltage or fixed bias component for establishing the operating level and gain of the volume-compression system is also derived from the terminal 67 across the fixed cathode resistor voltage source 78–79. This bias voltage is adjusted in value or level setting by voltage-divider potentiometer means comprising a movable contact 90 on a potentiometer resistor 91 connected between the positive supply terminal 67 and system ground 38. This connection is made through a series voltage-dropping resistor 92 and a supply lead 93 connected between the resistor 92 and the terminal 67. It will be noted that in this case the "upper" or high terminal 95 of the potentiometer resistor 91 is connected to system ground 38 while the opposite or "lower" terminal 96 is connected to the output end of the series resistor 92 and thus to the positive supply terminal 67. Therefore the terminal 96 is at the "low" volume end of the resistor and the terminal 95 is at the "high" volume end of the resistor 91.

Thus the movable contact 90 operates to derive a negative voltage with respect to the terminal 67 and the cathode 43, within the limits of the cathode voltage $E_K$ and to provide an adjusted or fixed negative bias voltage $E_F$ with respect to the cathode. This voltage is applied to the gain-control grid 44 at the terminal 87 through a supply connection which may be traced from the contact 90 through a supply lead 98 and a series isolating or filter resistor 99 to a terminal 100 and thence through a connection lead 101 to the terminal 87. In the present example, the potentiometer or level-control resistor 91 may be assumed to have a resistance value of 500,000 ohms, the series resistor 92 may have a value of 4700 ohms, and the isolating resistor 99 may have a resistance value of 1.2 megohms. At substantially ⅓ of the way down on the potentiometer or control resistor 91 is an upper tap or intermediate terminal 102 between which and the upper end terminal 95 is connected a shunt resistor element 103. Likewise substantially ⅓ of the distance up on the potentiometer resistor 91 is a lower tap or intermediate terminal 104 between which and lower end terminal 96 is connected a short-circuiting jumper conductor 105.

Because of the connection of the level or gain-control means 90–91 with the fixed potential source 78–79, each adjusted value of the gain control potential $E_F$ provided at the contact 90 with respect to the cathode 43 is substantially fixed for all operating conditions of the amplifier system. It is against this fixed level or gain control voltage that the compression gain control of the amplifier is applied, as will hereinafter be described.

The gain-controlled first amplifier stage 39 is coupled to apply signals to the second or cathode-follower and amplifier stage 40 through a coupling network between the anode 49 and the input grid 54. This includes an output or plate circuit lead 110 connected through load or output resistor means, comprising a main plate or load resistor element or section 111 and a series feedback or decoupling resistor element or section 113, to the positive operating-current or voltage supply lead 75. An intermediate or feedback terminal 112 is provided at the junction between the resistor sections 111 and 113. The plate terminal 114 of the load resistor 111 is coupled through two series coupling capacitors 115 and 116 to the control grid 54 at a terminal 117 on the input grid circuit of the second stage.

Any suitable output circuit may be provided for the second stage since it is outside of the gain control loop between the amplifier stages. In the present example, the plate 55 of the second stage amplifier device 52 is coupled through an output or plate circuit 118 and a coupling capacitor 119, across the impedance of a suitable plate load or output resistor 120, to a signal output circuit lead 121 connected with the output terminal 28.

The cathode 53 is connected to system ground 38 through a cathode circuit comprising two series-connected cathode resistor elements 124 and 125 with an intermediate or feedback tap or terminal 126 at the junction therebetween. The cathode resistor elements 124 and 125 are unbypassed and provide relatively low cathode circuit impedance or resistance, having respectively resistances of 470 and 4700 ohms in the present example. Likewise the plate or output circuit is of relatively low resistance, the plate load or output resistor 120 having a value of substantially 10,000 ohms for example.

The terminal 126 on the unbypassed cathode resistor means is connected to apply cathode bias to the grid 54 through a grid resistor 128 connected between the grid terminal 117 and a feedback circuit lead 129 connected with the terminal 126. The lead 129 is also connected through an input shunt coupling resistor 130 to a terminal 131 at the junction of the coupling capacitors 115 and 116 to serve as part of the input coupling network for the grid 54. The lead 129 from the terminal 126 is also coupled to the terminal 112 at the junction of the plate circuit resistor sections 111 and 113 through a feedback coupling or booster capacitor 132 which completes the signal feedback path between the output plate circuit of the first stage and the cathode resistor of the second stage.

The terminals 112 and 114, at opposite ends of the plate resistor 111 in the first-stage plate circuit, may thus operate at substantially the same signal potential due to the coupling of the output circuit of the first stage to the cathode circuit of the second stage in a "bootstrap" type of circuit connection. This effectively raises the apparent load impedance of the first stage, thereby resulting in maximum gain therefrom without having excessive voltage drop across the plate load resistor 111 which may be made relatively low in resistance, as will hereinafter further be described.

The low-impedance cathode circuit of the second stage is also utilized as a source of signal potential to operate the volume or amplitude-compression portion of the system. The entire signal voltage $E_S$ available across the cathode circuit impedance means 124–125 may be taken, with respect to ground 38, from a cathode terminal 135 through a feedback lead 136, a series control resistor 137 and a coupling or blocking capacitor 138, to a diode rectifier circuit comprising a series diode 139 and a shunt diode 140. The series diode 139 is connected between the capacitor 138 and the terminal 100, and in the present example for forward conduction from the terminal 100.

The shunt diode 140 is connected between the cathode terminal 69 and an intermediate terminal 141 between the coupling capacitor 138 and the series diode 139. The diode 140 is connected for forward conduction from the terminal 141 to the terminal 69.

The diode signal supply circuit or current path may be traced from the cathode terminal 135 through the resistors 124 and 125 through the ground connections 38 to the cathode or supply resistor 78, thence through this resistor to the positive supply terminal 67 and the cathode terminal 69, and through the capacitor 88 and the lead 101 to the terminal 100. From the terminal 100 the diode circuit further continues through the series diode 139, the coupling capacitor 138, the series resistor element 137 and the feedback lead 136 to the cathode terminal 135. Thereby the signal voltage $E_S$ is impressed upon the diode circuit. This circuit provides for applying amplitude compression control to the system in the presence of strong signals above the level set by the level control means 90–91, as will hereinafter be described in connection with the operation of the system. The two diodes operate basically as a voltage doubler providing an increased control voltage.

In the present two-channel stereophonic sound-reproduction system, the second signal-translating channel 27 is a duplicate of the first channel 26 above described. The two channels may briefly be correlated by reference to certain of the corresponding circuit elements therein, which are designated by the same numerical references with the letter A added. A further understanding of the joint operation of the two channels will be gained from the operation hereinafter described. Thus in the left signal-amplifying or translating channel 27, the two amplifier stages 39A and 40A are provided respectively with amplifier tubes 42A and 52A cascade-coupled for signal translation and signal feedback through like-numbered circuit elements in the first-stage output circuit 110A and the interstage feedback circuit 136A, the latter including the diodes 139A and 140A together with the series coupling elements 137A and 138A across the low impedance of the cathode resistor elements 124A and 125A, all as hereinbefore described for channel 26.

In this amplifier channel, the third or signal input grid 46A of the gain-controlled first-stage, is connected through the decoupling resistor 58A and the input coupling capacitor 59A with the input terminal 22 for the left-channel signals, across the input impedance of the grid resistor 60A. This resistor is connected to the terminal 61 and thence to the fixed bias supply source provided in connection with the supply lead 62, as in the case of the right-channel amplifier. The screen-grid bleeder and control resistor means 74A and 76A are connected to the same system or common ground 38 as are the cathode circuit resistor elements 124A and 125A for the second stage amplifier. It will be noted that the cathode terminal 69A for the first stage amplifier tube 42A is connected to the gain-control grid terminal 87A through the stabilizing capacitor 88A, and also is directly D.-C. connected to the cathode or bias supply terminal 67 through a connection lead 68A in common with the cathode 43 for the first stage of the right-channel 26.

In other words, in a stereophonic or dual-channel signal translating system having amplitude-compression gain-control in both channels, in accordance with the invention, both first-stage cathodes are maintained at the same potential with respect to common system ground. Also both gain-control grids 44 and 44A are jointly set for the same signal gain level by the adjustment of common control means comprising the control potentiometer 90–91, the grid 44A being connected from the terminal 87A through the series isolating resistor 99A and a supply lead 98A to a terminal connection 150 with the lead 98 and the control contact element 90. The same adjustible level control bias $E_F$ is thereby applied to the grid 44A with respect to the cathode 43A for the second or left channel 27.

The output circuit from the second-stage amplifier tube 52A is indicated at 118A and is coupled to the output terminal 29 for the left channel through the coupling capacitor 119A across the impedance of the output load resistor 120A. The compression control system then operates to provide controlled output signals to the respective right and the left-channel signal circuits coupled thereto in response to input signals applied to right and left channel input terminals of the system.

The dual tone control circuits 34 indicated may be of any well-known construction and arrangement, and represent any intermediate signal-controlling and translating elements for a system of this type through which the dual-channel circuitry herein provided extends to individual left and right-channel variable volume-control elements in the system volume control means 35. These may be in the usual form of potentiometer resistors 152 and 153 respective individual movable contacts or control elements 154 and 155 for signal output control.

In the circuit construction shown in the present example, the right-channel potentiometer element 152 is connected between a channel output lead 156 from the tone control circuits 34 and common ground 38 for the system. This ground is also connected with the tone control circuits 34 and the dual channel amplifiers 33 as a common ground circuit connection means for the two channels. The volume-control contact 154 is connected through a lead 157 to apply the right-channel signals to the right-channel side of the power or output amplifier 33, and thence through the amplifier to the right channel speaker 31 which is also connected to system ground 38.

Likewise the left-channel potentiometer element 153 is connected between a corresponding channel output lead 158 and system ground 38, and the volume control contact 155 is connected through an output lead 159 to apply the left-channel signals to the left-channel side of the amplifier 33 and thence to the left-channel speaker 32, which is connected to system ground 38.

In the present dual-channel system, as is customary, the movable control elements 154 and 155 of the volume control means are gang-connected, as indicated by the dotted connection line 160, for joint operation by a common control means such as a control knob 161. These elements thus represent any suitable means for dual or joint operation to control the overall volume level of the system following the gain-controlled volume-compression amplifying system.

The volume control means for the system is further gang-connected with the level-control element 90 for joint operation therewith, as indicated by the dotted line connection 163. This operating connection provides that as the volume control contacts 154 and 155 are jointly moved (upwardly as viewed in the drawing) to increase the overall volume or gain of the system, the level-control contact 90 for setting the gain of the amplifier stages 39 and 39A is moved likewise in an "upward" or increasing negative-bias direction toward the terminal 95. This operates to set the fixed negative bias voltage $E_F$ to higher values on the gain control grids of the amplifier stages 39 and 39A, and as a higher delay voltage on the diode circuit.

While the amplifier system of the present example is adapted as a dual-channel stereophonic compression amplifier for controlling the dynamic range of the information on a stereophonic record, each amplifier channel may operate independently or may be used alone in any particular system. The present system, as provided in either channel between the input terminals and output terminals thereof, has been made to achieve a compression of approximately 20 db within the dynamic range of a recording or like wide range sound source. A single channel may similarly control the dynamic range of any sound signal applied thereto, as from the second detector of a radio receiver for example, or from any other audio-frequency sound signal source.

Considering the operation of the system in accordance with the invention, and with reference more particularly to the right channel 26, the pentagrid tube 42 provides a gain-controlled audio-frequency amplifier stage and the triode tube 52 in the second stage 40 operates as a combined cathode-follower and amplifier. The audio-frequency signal voltage $E_S$ developed in the cathode circuit is rectified in the diode circuit, which includes the diodes 139 and 140, and produces a D.-C. control voltage $E_C$ between the gain-control grid and the cathode of the gain-controlled amplifier stage. This provides a form of automatic gain-control which is effective above the bias or delay level set by the control means 90–91. The low impedance, comprising the resistor elements 124 and 125, in the cathode circuit of the triode amplifier permits the extraction of the required power for the diode circuit to produce the compression control voltage $E_C$, without excessive distortion in the output signal delivered at the compression-amplifier channel output terminals 28–30.

The diode rectifier system for the D.-C. compression control voltage is a peak type detector, drawing current on the peaks of the audio waves. If the instantaneous load represented by the conducting diodes 139 or 140 were significant compared to the source impedance, these current pulses could represent distortion across the cathode circuit from which the load current is drawn. In this circuit, the source impedance is largely the 4700 ohm cathode resistor 125, plus the 470-ohm resistance of the bias section 124. The impedance of the diode circuit, due to the series resistor 137 of substantially 100,000 ohms, is thus relatively high so that it introduces negligible distortion across this cathode circuit.

In the present example, the components of the rectifier circuit provide an attack time of approximately 25 milliseconds and a recovery time approximately 250 milliseconds. These time constants for the diode circuit are largely determined by the series resistor 137 and the shunt capacitor 88 between the control grid and the cathode, on the attack phase of the control action when the diode 139 is conducting, and the capacitor 88 and the series isolating resistor 99 of substantially 1.2 megohms, provide the control elements for the recovery time when the diode 139 is nonconducting.

During this time the diode 140 conducts to provide a current path for the alternate half waves of the applied signal, while at the same time providing no load across the diode circuit on the active portion of the rectifying cycle through the diode 139. This action provides a relatively higher control voltage $E_C$ across the capacitor 88 and thus improves the performance of the gain-control loop between the two stages, that is, from the signal-input grid 46 of the first stage through the interstage coupling means to the second stage cathode circuit 124–125, and back through the compression bias control circuit to the first gain-control grid 44. A resistive D.-C. current path, which the shunt diode 140 replaces in this diode circuit, would adversely load the circuit thereby reducing this control voltage appreciably with the minimum number of amplifier stages as desired, and as shown. It may be noted that in this circuit the coupling capacitor 138 has a limited effect upon the attack time. It is primarily a D.-C. blocking capacitor for the diode feedback circuit.

Higher control loop gain for more effective compression control action is further provided in the interstage signal coupling means. Part of this coupling means is the "bootstrap" type of plate circuit coupling for the first amplifier stage with the cathode circuit of the second amplifier stage. This includes the series plate resistor elements 111 and 113, and the feedback or booster coupling capacitor 132 between the terminal 112 and the intermediate terminal or tap 126 on the unbypassed cathode resistor means in the second amplifier stage. Thus the signal voltage at the terminal 126 varies in the same sense as that at the grid 54 and in accordance with corresponding signal voltage variations at the terminals 112 and 114 of the load or output coupling resistor 111 in the plate circuit. Therefore the effective plate load is raised, thereby appreciably raising the gain of the stage.

By this means, a small current change in plate current in the output circuit 110 through the load resistor 111 creates a voltage at the plate, or the plate terminal 114 of the plate load resistor 111, which is the sum of the voltage at the opposite or feedback terminal 112 plus the potential drop across the resistor. Thus the signal voltage applied to the second stage grid 54 may be three or four times as much, in the present example, as that across the resistor 111 alone, in the absence of the other components. This circuitry is thus included in the compression control loop in order to aid in achieving a relatively high gain therein without resorting to costly higher tube gain with low apparent plate loads.

The variable control element 90 of the level-control means 90–91 is ganged to the main or overall system volume-control means 35 and jointly controllable therewith to provide a related variable bias delay for the compression control voltage $E_C$ delivered from the diode circuit, as well as the channel level or gain-setting bias on the gain-control grid 44. Due to the gang connection, reduced compression is provided as the main volume setting is advanced or increased. In other words, as the main volume control means is moved to increase the sound output for a given signal input amplitude, the control contact 90 of the level-control means moves in the same direction, thereby increasing the fixed bias voltage $E_F$ in a negative direction with respect to the cathode terminal 69 and thereby the negative bias voltage on the control grid 44 and the diode circuit.

In the present example, the bias voltage change produced by the level control means 90–91 in response to progressive incremental movement of the volume control means 35, that is, the shape of the voltage response curve of this variable control means 90–91, is varied by the externally-connected shunt current-conducting elements across the tapped portions thereof. These include the resistor 103 connected between the upper tap 102 and the high end terminal 95, and the shunt conductive connector 105 connected as a short-circuit between the low end terminal 96 and the first or lower tap 104. This provides for effectively full compression control for the system, with no negative delay bias other than that provided by the series resistor 92, in response to applied signals, as the level control means is adjusted by movement of the contact 90 from the terminal 96 to the lower tap or terminal 104 over substantially one-third of the control range in the present example. This portion of the control is thus short-circuited, and therefore the bias voltage $E_F$ does not vary while the main volume control setting is thus likewise jointly advanced or increased by a similar amount by the common control element 161.

In the present example, the major portion of the control of the compression level with respect to the main volume-control setting is obtained between the lower tap 104 and upper tap 102, after which movement of the control contact 90 provides a substantially reduced change in the voltage $E_F$ because of the shunting affect of the resistor element 103. Thus as the contact 90 moves from the lower tap 104 to upper tap 102 the voltage at the lead 98 changes in a negative direction from that established by the drop in the series resistor 92. This progressively puts in increasing negative bias voltage between the lead 98 and the cathode terminal 69. This voltage is applied through the filter resistor 99 to the terminal 100 to effectively bias off the diodes 139 and 140 with the result that they do not conduct until this bias voltage is overcome by the applied signal feedback from the low-impedance cathode circuit of the second stage. Therefore the bias on the control grid 44, and likewise the control grid 44A of the other channel in the present example, is determined by the fixed bias $E_F$ only until the applied audio-frequency signal is of sufficient amplitude to provide a rectified control voltage which overcomes the bias and applies compression, that is, increased negative bias, on the gain-control grid or grids.

Progressively less variable and more fixed bias is attained with this system as the main volume control setting is advanced to carry the level control contact 90 from the bottom tap 104 to the top tap 102, effectively during the middle one-third of the rotation or control movement. By the time the top tap is reached, the need for compression is considerably reduced, and very little additional change is provided as the main volume control setting is advanced to simultaneously carry the contact 90 from the top tap 102 to maximum at the terminal 95. This is because the D.-C. voltage available across the section at the upper end of the control resistor 91 is reduced by the shunting resistor 103 which may, as indicated in the present example, have a resistance of 47,000 ohms, while the entire potentiometer resistor 91 may have an overall resistance of 500,000 ohms. This control action as provided by the shunting elements, can be achieved with potentiometer control means having a predetermined resistance taper although this may involve higher cost, and also complication when changes are desired in the control action. The tapped control element 91 is thus an added convenience in determining the control action in the over all performance of the system.

Referring to the graphs in FIGURE 2, four levels of volume control setting show the compression response of the system, assuming 100 db output along the vertical axis to represent maximum undistorted output with 1 volt input at the zero db level along the horizontal axis. The response curve 165 represents the operation with the volume control at maximum setting and with no compression control. Full power output may be attained with a signal input level well below the zero level.

The response curve 166 shows the effect of adding compression in a system as shown and described. The full signal amplitude of 1 volt brings the output to the full 100 db limit. With the dotted extension of the curve is indicated the results with and without compression.

At the top tap on the level control element 90–91, the compression response of the system is as shown by the curve 167, while the curve 168 shows the response at the bottom tap. In both, the effect of the compression may be noted as the applied input signal is increased in amplitude toward the 1 volt level. More and more compression serves to reduce the output sound level above a definite threshold in each case indicated by the change or leveling-off in the slope of each curve beyond the straight portion. Further consideration of this operation will be given hereinafter.

It will be noted that the audio-frequency compression amplifier system provided in either channel is maintained single-ended. The system operates in this manner without the benefit of push-pull or balanced circuits. Undesired sound signal components or sound output (thump), due to dynamic changes in plate or operating currents responsive to the compression control action when the signal amplitudes varies widely, are prevented from developing. These sound components, generally associated with single-ended compressors, are negligible in this system as will be seen from a consideration of this phase of its operation.

An increase in signal strength represents a positive going shift or pulse in the plate circuit 110 of the first-stage amplifier 39 and at the cathode terminal 135 of the second stage amplifier 40. This positive-going pulse is transferred to the diode circuit in a reverse-bias direction as is seen, and hence operates to bias off the rectifiers. This prevents an increase in the bias and hence an accumulative thump or sound component. This degenerative action of the D.-C. component of the signal thus substantially prevents sudden direct current shifts in the signal circuits from producing undesired output sound components as above referred to. Assuming a sudden increase in signal strength through the system from any source which may be connected with the terminals 21–18, it will be seen that an increase in audio-frequency voltage will appear at the grid 54 and hence at the cathode terminal 135 of this cathode-follower amplifier stage. This is peak detected by the diode circuit as described, thereby causing a negative voltage to be developed on the first control grid 44, and likewise the control grid 44A in the present example, with respect to the cathodes and the supply terminal 67.

The negative voltage creates a positive voltage on the plate of the first amplifier stage tube 42, part of which is transmitted through the interstage coupling as a pulse to the grid 54 and hence to the cathode terminal 135 of the second stage amplifier. This positive pulse on the cathode terminal 135 is transmitted as a positive pulse on the diodes 139–140. Some of the effect of this pulse is dissipated at the diodes since a positive pulse tends to open up the series diode 139. Any positive effect which is present on the grid side of the diode 139, that is, at the terminals 100 and 87 and the grid 44 per se, is opposed to the original negative signal pulse on the grid 44 and therefore appears as degeneration of the original D.-C. shift. The result is an inperceptible D.-C. shift without any wave forms which cause undesirable thump or like sound effects in the signal translation through the single-ended compression amplifier system shown.

The input coupling means for the second stage grid circuit includes the series coupling-capacitor elements 115 and 116 and the associated shunt resistor elements 128 and 130 forming the second stage input grid circuit. With the feedback circuit capacitor and resistor elements 132 and 113, respectively, in the coupling network with the output circuit of the first stage, these elements provide good low-frequency response and a cutoff characteristic which, in conjunction with the attack time determined by resistor 137 and the capacitor 88, is effective to minimize "thump" and like sound components.

The two R-C input coupling elements 115–130 and 116–128, provide in the present example, a 12 db/octave low-frequency roll-off, while the boost or feedback circuit R-C elements 132–113 provide a gain within the desired frequency response range of the system and a corresponding low-frequency attenuation below that range. This network thus provides attenuation of these undesirable low-frequency components with a sharp cutoff rate to permit the desired low-frequency sounds, in music for example, to be unaffected.

The volume or amplitude-compression system of the present invention further includes several circuit features tending to prevent distortion in the signal translation therethrough. A first of these is the unbypassed for audio frequencies series-fed screen grid 45–47 in the right-channel first amplifier stage 39 which permits a wide screen voltage excursion without time constant problems in the control circuit, and permits the first stage pentagrid amplifier tube 42 to handle several volts of input signal on the signal input grid 46 without distortion.

The bleeder resistor 76 of 200,000 ohms, in connection with the relatively high series screen resistor 74 of 100,000 ohms, provides a light bleeder current to ground to prevent the screen voltage from raising too high under cutoff conditions when the gain-control grid 44 is biased high negatively on signal peaks. However, the high series screen resistor 74 causes the screen voltage to drop to a normal value below that of the plate on zero and low input signal conditions and thereby permitting normal plate operation. On strong signals the electron stream of the tube is largely cut off by the gain-control grid 44 and therefore both the plate and screen potentials rise as the plate and screen currents are reduced. This permits the tube to handle large input signals on the third or signal input grid 46 without distortion, as above noted, and since it is necessary that the screen voltage change without the delay for this operation, the screen circuit resistor elements are unbypassed to low audio frequencies in this system.

A further aid to signal translation through the gain-controlled amplifier, for improved volume compression without distortion, is provided by the D.-C. conductive and highly resistive connection provided between the gain control grid 44 and the signal input grid 46 through the 12 megohm resistor 72. This provides for a slight amount of D.-C. control voltage, as applied to the gain-control grid 44, to be applied over to the signal input grid 46 to improve the signal handling capabilities of the stage at relatively high input signal amplitudes or levels.

Through this high-resistance D.-C. connection, the grid bias on the signal grid 46 is caused to increase slightly as the signal amplitude causes the gain-control grid 44 to go considerably negative. At the same time, the grid and plate voltages go more positive. Thus the proper conditions are set up to enable the tube to handle the largest possible input signal without overload distortion. This higher D.-C. bias on the signal input grid 46, is therefore, not present under low signal conditions, and would be undesirable since the plate and screen voltages are lower and the relatively-high grid bias on the signal input grid would represent less than maximum gain conditions. Thus this circuit connection provides for improving the operating capability of the amplifier under overload conditions without affecting normal high-gain operation under normal signal conditions.

The small coupling capacitor 71 connected between the plate 49 and the signal input grid 46 of the first stage amplifying tube 42 is of a value, such as the 2 mmf. referred to, for permitting a slight amount of high-frequency degeneration from the plate to the grid. This coupling is effected across the series impedance introduced in the input circuit by the decoupling resistor 58. As is understood, this type of degeneration varies with the gain of the tube and hence is effective to reduce the amplitude of high-frequency signal components such as record surface noise, static noises and the like, carried by the translated signal when the channel gain is at its maximum, as is the case during low-level passages in record reproduction, and likewise radio and television sound-signal transmission. While the capacity of the capacitor 71 is maintained relatively low in the interest of high-fidelity signal translation through the system, the 2 mmf. capacity represents a considerable shunt capacity when the signal level or amplitude is low and the gain is high as noted, due to the Miller affect, and therefore, through this circuit means, the higher audio-frequency signal components containing noise may be effectively attenuated during low or no-signal intervals in the operation. However, as the signal amplitude increases the gain decreases due to the signal-responsive control bias on the gain-control grid 44, and therefore the effective capacity at 71 is reduced on strong signals, for full frequency response. This feature is of value in the present system for affecting noise reduction during blank passages in the applied signal because the gain is normally set somewhat higher than is normal and the zero signal gain is increased over a normal amplifier.

It will be seen that, in the stereophonic or dual-channel amplifier of the present example, each of the compression control channels operates independently of the other in response to changes in signal amplitude of the signals translated therethrough. In other words the volume-compression signals derived from the low-impedance cathode circuit of the second stage amplifier tube 52 of the right channel 26 are applied through the feedback circuit lead 136 to the diode circuit and the capacitor 88 connected with the gain-control grid 44 of the first stage amplifier tube 42.

In the left channel 27, similarly, the compression signal from the cathode circuit of the second amplifier tube 52A is applied through the feedback circuit lead 136A to the diode circuit and the capacitor 88A for controlling the compression bias on the gain-control grid 44A of the first stage amplifier tube 42A. Thus each channel may operate independently of the other for compressing the amplitude of the stereophonically-related signals translated therethrough. The level control for both amplifier channels is derived from the common control element 90–91 through circuits which have hereinbefore been described. The operating level in both channels may thus be the same in connection with signals from a common source, such as the source 10 in the present example, being substantially the same program material with differences in amplitude and sound characteristics as is normal with two stereophonically-related signals.

Therefore it may be desirable under some operating conditions to provide compression control of two or more signal translating channels of this type from the signal in one of the channels, particularly where the signals are all related to some degree in amplitude as above pointed out. Thus, in the present system, means may be provided for connecting the two gain-control grids 44 and 44A, in the respective right and left first amplifier stages, for joint operation. This connection may be provided by a single connection lead 174 connected between the grid terminal 87A in the left channel 27 and the grid terminal 87 in the right channel 26 through switch means 175 which may normally remain open as shown. When the switch means 175 is closed, the two grids are D.-C. conductively tied together and may thus receive compression control voltages from either of the rectifier circuits and capacitors 88 or 88A when the other of the rectifier circuits is de-energized with respect to signal supply.

Therefore when both channels are to be compression-controlled jointly by signal amplitude variations in the right channel 26 in response to the signal voltage $E_S$, the diode signal supply circuit is cut off or opened, as by a link connection 176 which may be opened between the feedback lead 136A and the cathode terminal 135A in the left channel second amplifier stage 40A. Likewise when the volume compression control for the system is to be derived from left-channel signal amplitude variations alone, a similar link connection 177 between the cathode terminal 135 and the feedback lead 136 in the right channel second amplifier stage 40 is opened to cut off the signal supply to the diode circuit. In either case the switch 175 is then closed. Normal independent operation of the two channels for volume or amplitude compression is restored when the switch 175 is opened and the two links 176 and 177 are closed as shown.

Referring now to the graph shown in FIGURE 3, along with that shown in FIGURE 2 as described, an audio-frequency or sound signal having relatively-wide amplitude variations or peaks will have an apparent loudness, on reproduction through a sound translating system, which is not determined by the maximum amplitude or peaks in the signal, and therefore a certain degree of compression may be applied to such a signal without having any appreciable effect upon the apparent loudness of the sound output of the system.

A residual volume compression of from 3 to 6 db may be maintained in an amplifier system on the peaks of the input signal, as provided in the present system, and this degree of compression will thus have no appreciable effect upon the loudness of the output. This characteristic indicates that volume or amplitude compression can thus achieve from a lower wattage amplifier, the apparent loudness normally requiring a much higher wattage amplifier without this compression. This saving in output power requirement represents an appreciable cost reduction, which further indicates the desirability of including the compression circuit of the present invention in commercial equipment of the type referred to. As pointed out hereinbefore, the system is useful to reduce the dynamic range of information in any audio-frequency signal and can be used to advantage in phonograph, radio and television combination instruments for home use to permit the reproduction of wide dynamic range sound-signals at low background music sound levels without dropping a significant portion of the dynamic range below such levels.

In FIGURE 3, the operation of the present system with reference to a sound level or db scale is represented. The loudest passage to be translated by the system, as from a phonograph record for example, may be represented by an amplitude or db scale value of 100, as at the level A for example. Assuming a reasonable normal recording range of 60 db the softest passage will then be at 40 db or the level B. There is thus a 60 db recording range variation in amplitude between the levels A and B which must be translated. If the maximum level A at 100 db provides a sound level that is too high at the output of the system, for comfortable listening, the upper or maximum level setting for the same recording range may be reduced, for example, to 70 db at the level C. Then the low-level passages may be on the order of 10 db at a level D, substantially below a reasonable noise level E of slightly below 30 db, if the same 60 db signal amplitude-variation range, as shown, is retained. Under these conditions, the noise level will "come up" in the manner indicated, and be within the signal range on the low passages.

If now the volume range is compressed to 40 db as indicated at E below the 70 db level at C, the signal will always be above the noise level and nothing useful will be lost in the reproduction. The apparent loudness is determined by the average loudness or amplitude between energy levels which are 10–20 db below the instantaneous peaks. Thus the peaks are 3 to 10 times as high as the average signal amplitude, and therefore if the amplifier has volume or amplitude compression in the upper 10–15 db of its input range, these peaks can be kept to a lower maximum instantaneous power without affecting the apparent loudness.

From the foregoing description it will be seen that an improved single-ended audio-frequency signal amplitude-compression system may be provided which is quiet in its operational control functions and yet is adapted for the reproduction of wide dynamic range audio-frequency signals at low background music or sound levels, without introducing distortion and without the loss of significant portions of the original dynamic signal or sound range below a set level or threshold value. In doing this, it provides a high degree of control gain in a low-cost two-stage amplifier, and is therefore well adapted for use with radio, phonograph and television systems for maintaining the sound output level within reasonable dynamic ranges for pleasant listening.

What is claimed is:

1. An audio-frequency signal amplitude-compression system comprising first and second electronic-tube signal amplifier stages cascade-coupled for signal translation and feedback-coupled for amplitude-compression gain control from the second to the first stage in an overall compression control loop, said control loop including a gain-control grid circuit in the first stage, an unbypassed cathode circuit in the second stage for developing a feedback signal, a diode rectifier circuit coupled to said cathode circuit to derive a direct current control voltage that is a function of the amplitude of the feedback signal and connected with the gain-control grid circuit of the first amplifier stage for applying said control voltage thereto to control the gain of said first signal amplifier stage, a cathode resistor connected to said first amplifier stage, means connected to said first stage cathode resistor for stabilizing the voltage across said resistor to provide a substantially fixed cathode and bias potential, variable control means connected between said first stage cathode resistor and said gain-control grid for applying a variable control bias to the gain-control grid circuit of the first stage to set the operating gain thereof and for applying an operating threshold bias to said diode rectifier circuit to control the conduction thereof as a function of said variable control means setting, whereby the gain of said first amplifier stage is determined by the control bias on said gain control grid and the feedback signal exceeding the operating threshold bias on said diode rectifier circuit.

2. An audio-frequency signal translating system comprising a single-ended electronic-tube amplitude-compression amplifier having first and second signal amplifier stages cascade-coupled for signal translation and feedback-coupled for amplitude-compression gain control from the second to the first stage in an overall compression-control loop, said control loop including a gain-control grid circuit in the first stage and unbypassed cathode-resistor means in the second stage, a diode rectifier circuit coupled to said second-stage cathode-resistor means to derive and rectify signals therefrom and having a compression gain-control connection with the gain-control grid circuit of the first amplifier stage for amplitude-compression of the signal translation therethrough, a cathode resistor connected to said first amplifier stage, means connected to said first amplifier stage cathode resistor for stabilizing the voltage across said resistor to provide a fixed source of cathode and bias potential, variable control means connected between said source of bias potential and said gain-control grid circuit for applying a level-control bias to the gain-control grid circuit of the first stage to set the operating gain thereof and for applying a variable threshold bias to said diode circuit whereby the gain of said first amplifier stage is determined by the level-control bias and the signals derived from said second stage unbypassed resistor means exceeding said threshold bias.

3. An audio-frequency signal translating system comprising a single-ended electronic-tube amplitude-compression amplifier having first and second amplifier stages cascade-coupled for signal translation and feedback-coupled for amplitude-compression gain control from the second to the first stage in an overall compression control loop, an overall system volume control means coupled to the output of said second amplifier stage, said control loop including a gain-control circuit in the first stage connected for controlling the signal gain therethrough, unbypassed cathode-resistor means in the second stage, a diode circuit coupled to the second-stage cathode-resistor means to derive and rectify signals therefrom and having an amplitude-compression gain-control connection with the gain-control grid circuit of the first amplifier stage, a cathode resistor connected to said first amplifier stage, means connected to said first amplifier stage cathode resistor for stabilizing a voltage across said resistor to provide a fixed source of cathode and bias potential, variable level-control means coupled between said source of bias potential and said gain control-grid circuit for applying gain-control bias to the gain-control grid circuit of the first stage and for applying a threshold bias to said diode circuit, thereby to provide gain-control signal-responsive feedback bias from the second stage to the first stage and volume compression action above a predetermined signal level, and means connecting said system volume control means and said variable level-control means for effecting variation in the degree of amplitude compression as a function of the main volume control setting for the system whereby said diode circuit is effective to provide amplitude compression gain control over a wider range of signals when said system volume control means is set for the lower level output than when set for a higher level output.

4. An audio-frequency signal translating system comprising in combination, a first-stage electronic-tube amplifier having a gain-control grid circuit and a signal-input grid circuit, a second-stage electronic tube amplifier having a signal-input grid circuit, an output circuit, and an unbypassed cathode circuit, volume level setting means coupled to said output circuit, interstage coupling means between said stages, a diode rectifier circuit coupled between said unbypassed cathode circuit and the control grid circuit of the first stage amplifier for applying amplitude-compression bias control thereto, said diode circuit including a stabilizing capacitor and a series resistor providing a relatively high resistance with respect to the cathode circuit and a relatively short attack time for said amplitude-compression control of said gain-control grid circuit, a cathode resistor connected with said first stage amplifier, means coupled to said first stage cathode resistor for stabilizing the voltage across said resistor to substantially a fixed value, means for deriving a fixed bias potential for the signal input grid circuit from said cathode resistor, and control means for deriving a variable bias for said gain-control grid circuit and a delay bias for the diode circuit from said cathode resistor, means for operating said variable bias control means in response to changes in the overall volume setting means of said signal translating system to apply an increased delay and gain control bias as the system volume level setting is advanced for higher level output, thereby providing for less amplitude compression at volume control means setting for higher level output than at lower level output.

5. In an audio-frequency signal translating system, a single-ended electronic-tube amplitude-compression amplifier having input and output terminals, signal translating and amplitude-compression means connected between said input and output terminals and comprising a first gain-controlled amplifier stage and a second cathode-follower and amplifier stage cascade-coupled for signal translation, a gain-control grid circuit in the first stage, means providing an unbypassed cathode circuit for the second stage, a high-gain dual diode rectifier circuit coupled to said second-stage cathode circuit to derive and rectify signals therefrom and having a gain-control connection with the gain-control grid circuit of the first amplifier stage, a cathode resistor connected to said first stage amplifier, means connected to said first stage cathode resistor for stabilizing the voltage across said resistor to provide a fixed source of cathode and bias potential, variable level control means coupled between said source of biased potential and said gain-control grid circuit for applying a gain-control bias to the gain-control grid circuit of the first stage and a delay bias to said diode circuit, and volume control means for said system coupled to said second stage and connected with said variable level control means for joint operation therewith to vary the system volume and the amplifier gain and delay bias in the same sense thereby providing for higher compression action at lower system volume level than at higher system volume level.

6. In an audio-frequency signal translating system, a single-ended electronic-tube amplitude-compression amplifier having input and output terminals, signal translating and amplitude-compression means connected between said input and output terminals and comprising a first gain-controlled amplifier stage and a second cathode-follower and amplifier stage cascade-coupled for signal translation and feedback-coupled for amplitude-compression gain control from the second to the first stage in an overall compression control loop, said control loop including a gain-control grid circuit in the first stage, means providing an unbypassed cathode circuit for the second stage, a diode rectifier circuit coupled to said second-stage cathode circuit to derive and rectify signals therefrom and having a gain-control connection with the gain-control grid circuit of the first amplifier stage thereby to utilize said cathode circuit as a source of signal voltage for amplitude-compression of the signal translation therethrough in response to signals above a predetermined operating level, a cathode resistor connected to said first amplifier stage means connected to said first amplifier stage cathode resistor for stabilizing the voltage across said resistor to provide a fixed source of cathode and bias potential, variable control means coupled between said source of bias potential and said gain-control grid circuit for applying a gain control bias to the gain-control grid circuit of the first stage and a delay bias to said diode circuit for establishing the operating level and gain through the amplifier and the diode delay bias and amplitude-compression level, and volume control means for said system coupled to said output terminals and connected with said variable control means for joint operation therewith to vary the system volume and the amplifier gain and delay bias in the same sense providing for higher compression action at lower system volume than at higher system volume.

7. A stereophonic dual-channel signal translating system providing amplitude-compression gain control in each channel and having main volume-control means coupled to said dual signal translating system to control the output volume level of said system jointly operable in both channels, said system comprising, first and second electronic-tube signal-amplifier stages cascade-coupled for signal translation in each channel, a gain-control grid circuit in the first stage and an unbypassed relatively-low-resistance cathode circuit in the second stage of each channel, a diode rectifier circuit connected to provide gain-control signal-responsive feedback bias from the second-stage cathode resistor to the first-stage gain-control grid circuit and amplitude-compression action above a variable signal gain level in each channel, a common cathode resistor connected to the first amplifier stage of both channels, means connected to said common cathode resistor for stabilizing the voltage across said resistor to provide a substantially-fixed cathode and bias voltage source, variable level-control means coupled between said cathode resistor and the gain-control grid circuit of both channels for applying a variable bias voltage to the gain-control grid circuits and delay bias voltage to the diode circuits in both channels for setting said gain level and diode delay bias therein for amplitude-compression action, and means connecting the overall system volume-control means and said variable level control means for joint operation in predetermined relation, whereby wide dynamic-range signals are translated through said system for reproduction at low background sound levels without loss of significant portions of the dynamic range by providing for compression action for a wider range of signals at low output volume level than at high output volume level.

8. An audio-frequency signal amplifying and compressing system comprising a plurality of amplifier stages cascade coupled for signal translation, one of said amplifier stages being a variable gain amplifier stage, signal input means coupled to the first amplifier stage of said plurality of amplifier stages, an output circuit coupled to the last amplifier stage of said plurality of amplifier stages adapted to be coupled to utilization means, a volume controlling potentiometer coupled to one of said plurality of amplifier stages other than said variable gain amplifier stage to control the signal level in said output circuit, first circuit means connecting said variable gain amplifier stage as a compressor stage for compressing the dynamic range of audio-frequency signals, gain control circuit means, coupled between said variable gain amplifier stage and one of said plurality of amplifier stages for deriving a gain control signal from said one of said plurality of amplifier stages that is a function of signal amplitude of said stage and for applying said gain control signal to said variable gain amplifier stage to control the gain thereof in a signal compression direction, second circuit means coupled to said control circuit means for applying a variable signal thereto to provide a predetermined signal amplitude threshold level that must be exceeded before said gain control circuit operates to change the gain of said variable gain amplifier stage, means responsive to the adjustment of said volume controlling potentiometer coupled to said biassing means to control said predetermined threshold level in a direction to increase the amplitude of audio-frequency required to produce compression as the volume controlling potentiometer is adjusted to increase the signal level in said output circuit.

9. An amplifier comprising a plurality of amplification stages coupled in cascade, one of said plurality of amplification stages having a gain control element, first means, including a rectifying circuit, connected for deriving signal energy from one of said plurality of stages subsequent said stage having a gain control element, for rectifying said signal energy and for applying said rectified signal energy to said gain control element in a signal compression direction, biasing means coupled to said rectifying circuit for applying a controllable compression delay voltage, a volume control potentiometer coupled to one of said plurality of stages subsequent said stage connected to said rectifying circuit for deriving signal energy therefrom, and means for conjointly varying said potentiometer setting and said biasing means in the direction to increase said delay voltage as said potentiometer is varied in the volume increasing direction thereby providing signal compression for a wider range of signal amplitudes at low settings of the volume control potentiometer than at high settings 10. An amplifier including a volume compression circuit including a variable gain amplifier stage and a fixed gain amplifier stage connected in cascade, means coupled to said variable gain amplifier stage for applying input signals to said variable gain amplifier stage, an output circuit coupled to said fixed gain amplifier stage, a controllable volume control means coupled to said output circuit and variable to a greater or lesser volume setting, volume compression means, including a rectifying circuit coupled between said variable gain amplifier stage and said fixed gain amplifier stage, for deriving signal energy from said fixed gain amplifier stage, for rectifying said signal energy and for applying said rectified energy in a signal compression direction to said variable gain amplifier stage, a variable biasing means coupled to said rectifying circuit for providing a greater or lesser compression delay voltage and for applying delay voltage to said rectifying circuit, and means for conjointly varying said variable delay means and said volume control in the same sense thereby providing signal compression for a wider range of input signal amplitudes at lesser volume setting than at greater volume settings.

11. An amplifier comprising a plurality of amplifier stages coupled in cascade, one of said plurality of stages having a gain control element, volume compression means coupled to one of said plurality of amplifier stages other than said first stage for deriving signal energy from said one of said plurality of amplifier stages, for rectifying said signal energy and for applying said rectified signal energy in a signal compression direction to the gain control element, being means coupled to said volume compression means for applying a controllable compression delay voltage to said volume compression means, a volume control means coupled to one of said plurality of stages other than said stage having a gain control element to control the output of said amplifier, and means for coupling said biasing means and said volume control means together for simultaneously changing said controllable delay voltage and said volume control setting in the directions to increase the volume control setting and to simultaneously increase said delay voltage thereby providing for decreasing signal compression for increasing volume control setting.

References Cited by the Examiner

UNITED STATES PATENTS

| | | | |
|---|---|---|---|
| 2,160,097 | 5/1939 | Weathers | 330—138 |
| 2,396,531 | 3/1946 | Reiskind et al. | 330—156 |
| 2,866,015 | 12/1958 | Sailor | 330—138 |

FOREIGN PATENTS

| | | |
|---|---|---|
| 870,284 | 3/1953 | Germany. |

OTHER REFERENCES

O'Connell and Rhodes: "Stereophonic Signal Compression System," RCA Technical Notes, June 1960.

ROY LAKE, *Primary Examiner.*

ARTHUR GAUSS, *Examiner.*